(12) United States Patent
Young

(10) Patent No.: US 6,472,909 B1
(45) Date of Patent: Oct. 29, 2002

(54) CLOCK ROUTING CIRCUIT WITH FAST GLITCHLESS SWITCHING

(75) Inventor: Steven P. Young, Boulder, CO (US)

(73) Assignee: Xilinx Inc., San Jose, CA (US)

(*) Notice: Subject to any disclaimer, the term of this patent is extended or adjusted under 35 U.S.C. 154(b) by 0 days.

(21) Appl. No.: 09/809,675

(22) Filed: Mar. 14, 2001

Related U.S. Application Data (63) Continuation-in-part of application No. 09/563,779, filed on May 2, 2000.

(51) Int. Cl.$^7$ .................................................. H03L 7/00
(52) U.S. Cl. .......................................... 327/99; 327/144
(58) Field of Search ........................... 327/409, 99, 408, 327/295, 144, 141, 407

(56) References Cited

U.S. PATENT DOCUMENTS

| | | | |
|---|---|---|---|
| 5,517,638 A | * | 5/1996 | Szczepanek .................. 327/99 |
| 6,204,695 B1 | | 3/2001 | Alfke et al. .................. 327/141 |

FOREIGN PATENT DOCUMENTS

| | | | | |
|---|---|---|---|---|
| JP | 402290322 A | * | 11/1990 | ................... 327/99 |

OTHER PUBLICATIONS

Peter H. Alfke, "Trouble–Free Switching Between Clocks", published First Quarter 1997 in Xilinx Publication XCell, available from Xilinx, Inc., 2100 Logic Drive, San Jose, California 95124.

* cited by examiner

*Primary Examiner*—Dinh T. Le
(74) *Attorney, Agent, or Firm*—E. Eric Hoffman; Julie A. Stephenson; Edel M. Young

(57) ABSTRACT

A clock routing circuit is coupled to receive a primary clock signal, a secondary clock signal, and a select signal, all of which may be asynchronous with respect to one another. When the select signal is in a first state, the clock routing circuit passes the primary clock signal as an output clock signal. At time $T_A$, the select signal transitions to a second state, thereby indicating that the secondary clock signal should be routed as the output clock signal. The first clock signal is prevented from being routed as the output clock signal at time $T_B$, wherein time $T_B$ is the first time that the first clock signal has a predetermined logic state after time $T_A$. The output clock signal is held at the predetermined logic state at time $T_B$. The second clock signal is then routed as the output clock signal the first time that the second clock signal transitions to the predetermined logic state after time $T_B$.

9 Claims, 8 Drawing Sheets

CLOCK ROUTING CIRCUIT WITH FAST GLITCHLESS SWITCHING

RELATED APPLICATIONS

The present application is a continuation-in-part of co-pending U.S. patent application Ser. No. 09/563,779 by Steven P. Young filed May 2, 2000.

FIELD OF THE INVENTION

The present invention relates to a clock routing circuit for routing two different clock signals in a glitch-less manner.

BACKGROUND OF THE INVENTION

The timing of events is key to proper processing within integrated circuits, such as user-defined logic devices. Accordingly, a single clock is typically used as a reference to determine the timing of events. Each process may be clocked from a single distributed clock signal, providing highly synchronized processing.

However, not all processes are active at all times. Therefore, some processes do not require a continuous clock signal. Continuously providing the primary clock signal to a process that does not require such adds unnecessarily to the power consumption of the chip. A significant cause of power consumption within a user-defined logic device is the power required to distribute the primary clock signal throughout the chip.

To lessen this power consumption, some users of user-defined logic devices utilize a portion of the resources of the logic device to route a secondary clock signal in place of the primary clock signal, wherein the secondary clock signal has a frequency much less than the frequency of the primary clock signal. Routing the secondary clock signal enables the user-defined logic device to enter a low power "sleep" state. Because the power consumed when providing a low frequency clock signal to a process is less than the power consumed when providing a high frequency clock signal to the process, the power consumption of the chip is reduced. To further reduce power consumption, some user-defined logic devices are capable of gating, or preventing the routing of, the primary clock signal. One such clock gating circuit is described by Alfke et al. in commonly owned, co-pending U.S. patent application Ser. No. 09/336,357, filed Jun. 18, 1999.

In addition, some integrated circuit chips must be capable of operating in response to two separate clock signals. For example, integrated circuits that operate in accordance with the proposed PCI-X bus interface standard must be able to operate in response to both a 133 MHz clock signal and a 66 MHz clock signal. That is, a PCI-X bus interface will typically operate in response to a 133 MHz clock signal, but must be backward compatible to operate in response to a 66 MHz clock signal.

A 2-to-1 multiplexer can be used to selectively route one of a primary clock signal and a secondary clock signal (or no clock signal). In this structure, the input terminals of the 2-to-1 multiplexer are coupled to receive the primary and secondary clock signals, and the output terminal of the multiplexer provides the selected clock signal. However, switching from one clock signal to the other can yield undesirable effects including glitches and runt pulses in the routed clock signal. In the present disclosure, a glitch or runt pulse is defined as a pulse having a width that is less than the width of the smaller of the primary or secondary clock signal.

It would therefore be desirable to have a clock routing circuit that eliminates undesirable clock signal disturbances, such as glitches and runt pulses.

SUMMARY

Accordingly, the present invention provides a clock routing circuit that is coupled to receive a primary clock signal, a secondary clock signal, and a select signal. When the select signal is in a first state, the clock routing circuit passes the primary clock signal as an output clock signal. When the select signal transitions to a second state, the clock routing circuit waits for the primary clock signal to transition in a predetermined direction (i.e., rising edge or falling edge). Upon detecting the transition of the primary clock signal, the clock routing circuit holds the state of the output clock signal. The clock routing circuit then waits for the secondary clock signal to transition in the predetermined direction. Upon detecting the transition of the secondary clock signal, the clock routing circuit passes the secondary clock signal as the output clock signal. By sequencing the transition between the primary clock signal and the secondary clock signal in this manner, clock signal disturbances are eliminated.

In one embodiment of the present invention, the primary and secondary clock signals are asynchronous. In another embodiment, the secondary clock signal can be replaced with a signal having a constant value. In yet another embodiment of the present invention, the predetermined direction can be selected by the user of the clock routing circuit. By selecting the predetermined direction to correspond with a rising edge, the output clock signal will have a logic high value when in transition. Conversely, by selecting the predetermined direction to correspond with a falling edge, the output clock signal will have a logic low value when in transition.

In another embodiment, when the select signal is in a first state, the clock routing circuit passes the primary clock signal as an output clock signal. When the select signal transitions to a second state, the clock routing circuit waits for the primary clock signal to reach a predetermined logic state. When the primary clock signal reaches the predetermined logic state, the primary clock signal is prevented from being passed as the output clock signal. At this time, a keeper circuit maintains the output clock signal at the predetermined logic state.

The primary clock signal may be in the predetermined logic state when the select signal transitions to the second state. In this case, the primary clock signal is immediately prevented from being passed as the output clock signal. Advantageously, there is no need to wait for a transition of the primary clock signal in this case.

The next time that the secondary clock signal transitions to the predetermined logic state, the clock routing circuit passes the secondary clock signal as the output clock signal. Because the keeper circuit is holding the output clock signal at the predetermined logic state at this time, there are no glitches in the output clock signal. Under worst case conditions, the time required to switch the output clock signal from the primary clock signal to the secondary clock signal is equal to one half cycle of the primary clock signal plus one cycle of the secondary clock signal. The output clock signal can be switched from the secondary clock signal to the primary clock signal in a similar manner.

The present invention also includes a control signal that can be asserted to maintain the source of the output clock signal, regardless of the state of the select signal.

The present invention will be more fully understood in view of the following description and drawings.

DETAILED DESCRIPTION OF THE DRAWINGS

Figure 1:
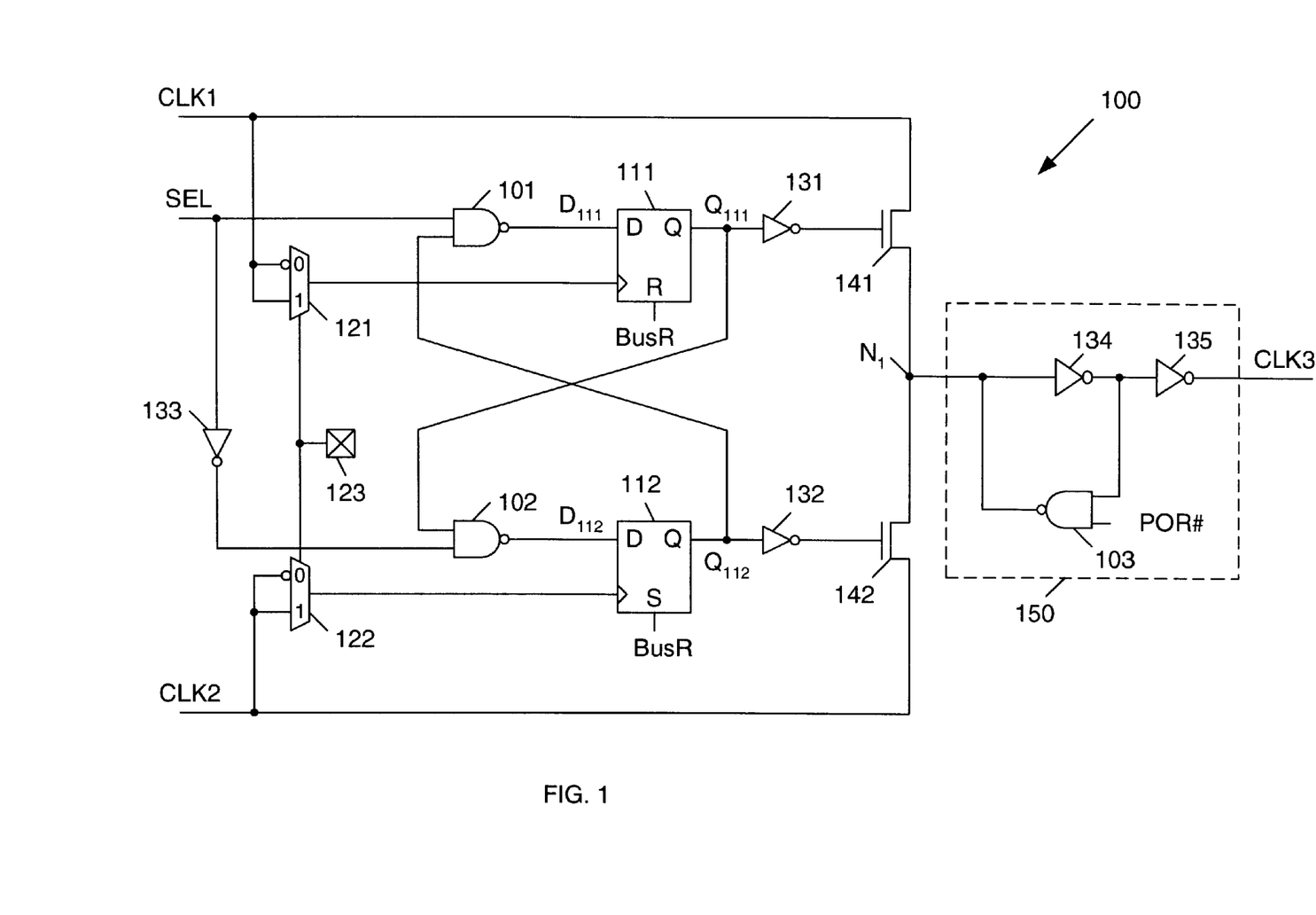
FIG. 1 is a schematic diagram of a clock routing circuit in accordance with one embodiment of the present invention.

FIG. 1 is a schematic diagram of clock routing circuit 100 in accordance with one embodiment of the present invention. Clock routing circuit 100 includes NAND gates 101–103, D-type flip-flops 111–112, 2-to-1 multiplexers 121–122, configuration memory cell 123, inverters 131–135 and n-channel pass transistors 141–142. Inverters 134–135 and NAND gate 103 are connected to form keeper circuit 150. While clock routing circuit 100 can be used for any type of integrated circuit, it is noted that clock routing circuit 100 is particularly intended for implementation on a field programmable logic device (FPGA).

A primary clock signal CLK1 is applied to inverting and non-inverting input terminals of multiplexer 121. Multiplexer 121 is controlled by a configuration value stored in configuration memory cell 123. Thus, if configuration memory cell 123 stores a logic "0" value, then multiplexer 121 routes the inverse of clock signal CLK1 (i.e., CLK1#). Conversely, if configuration memory cell 123 stores a logic "1" value, then multiplexer 121 routes the clock signal CLK1. The output terminal of multiplexer 121 is coupled to the clock input terminal of flip-flop 111. In the described embodiment, flip-flop 111 is a rising edge triggered flip flop. As described below, multiplexer 121 effectively enables flip-flop 111 to be triggered by either the rising edges or the falling edges of the CLK1 signal.

A secondary clock signal CLK2 is applied to inverting and non-inverting input terminals of multiplexer 122. Multiplexer 122 is also controlled by a configuration value stored in configuration memory cell 123. Thus, if configuration memory cell 123 stores a logic "0" value, then multiplexer 122 routes the inverse of clock signal CLK2 (i.e., CLK2#). Conversely, if configuration memory cell 123 stores a logic "1" value, then multiplexer 122 routes the clock signal CLK2. The output terminal of multiplexer 122 is coupled to the clock input terminal of flip-flop 112. In the described embodiment, flip-flop 112 is a rising edge triggered flip flop. As described in more detail below, multiplexer 122 effectively enables flip-flop 112 to be triggered by either the rising edges or the falling edges of the CLK2 signal.

A clock select signal SEL is provided to an input terminal of NAND gate 101. The Q output terminal of flip-flop 112, which carries output signal $Q_{112}$, is coupled to the other input terminal of NAND gate 101. The clock select signal SEL is also provided to inverter 133. In response, inverter 133 provides the inverse of the clock select signal SEL to an input terminal of NAND gate 102. The Q output terminal of flip-flop 111, which carries output signal $Q_{111}$, is coupled to the other input terminal of NAND gate 102.

NAND gate 101 provides input signal $D_{111}$ to the D input terminal of flip-flop 111. NAND gate 102 provides input signal $D_{112}$ to the D input terminal of flip-flop 112. Flip-flop 111 has a reset input terminal (R) coupled to receive a bus reset signal BusR. Flip-flop 112 has a set input terminal (S) coupled to receive the bus reset signal BusR.

The output terminals of flip-flops 111 and 112 are further connected to input terminals of inverters 131 and 132, respectively. The output terminals of inverters 131 and 132 are coupled to gate electrodes of pass transistors 141 and 142, respectively. The CLK1 and CLK2 signals are provided to the drain terminals of pass transistors 141 and 142, respectively. The source terminals of pass transistors 141 and 142 are commonly connected to node N1. The signal on node N1 is routed through inverters 134–135 and provided as the output clock signal CLK3.

The output terminal of inverter 134 is further coupled to an input terminal of NAND gate 103. The other input terminal of NAND gate 103 is coupled to receive the inverse of a power-on-reset signal (i.e., POR#). The output terminal of NAND gate 103 is connected to node N1. When the POR# signal has a logic high value, NAND gate 103 is configured as an inverter. Under these conditions, NAND gate 103 and inverters 134–135 form a keeper circuit that is capable of holding the state of the signal on node N1. Note that inverter 134 and NAND gate 103 are designed to be relatively weak devices relative to pass transistors 141 and 142. As a result, when clock signals CLK1 and CLK2 are driven onto node N1, these clock signals can easily change the state of node N1.

In one embodiment, the CLK1 and CLK2 signals are received on input pads of the user-defined logic device. The CLK3 signal is a global clock signal used by the user-defined logic device. Both the CLK1 and CLK2 signals are available for use within the user-defined logic device. Clock routing circuit 100 is implemented for each global clock input on the user-defined logic device and is activated by configuration memory cell bits. Clock routing circuit 100 is located at the periphery of the user-defined logic device (e.g., at the four corners of the device) and is not part of the core programmable logic of the device (e.g., not in the configurable logic block array). Thus, any process requiring a synchronous system clock receives either the CLK1 signal or the CLK2 signal, depending on the requirements of each process. In the described embodiment, the CLK3 signal follows the CLK1 or CLK2 signal with only one pass gate delay being added by clock routing circuit 100.

Figure 2:
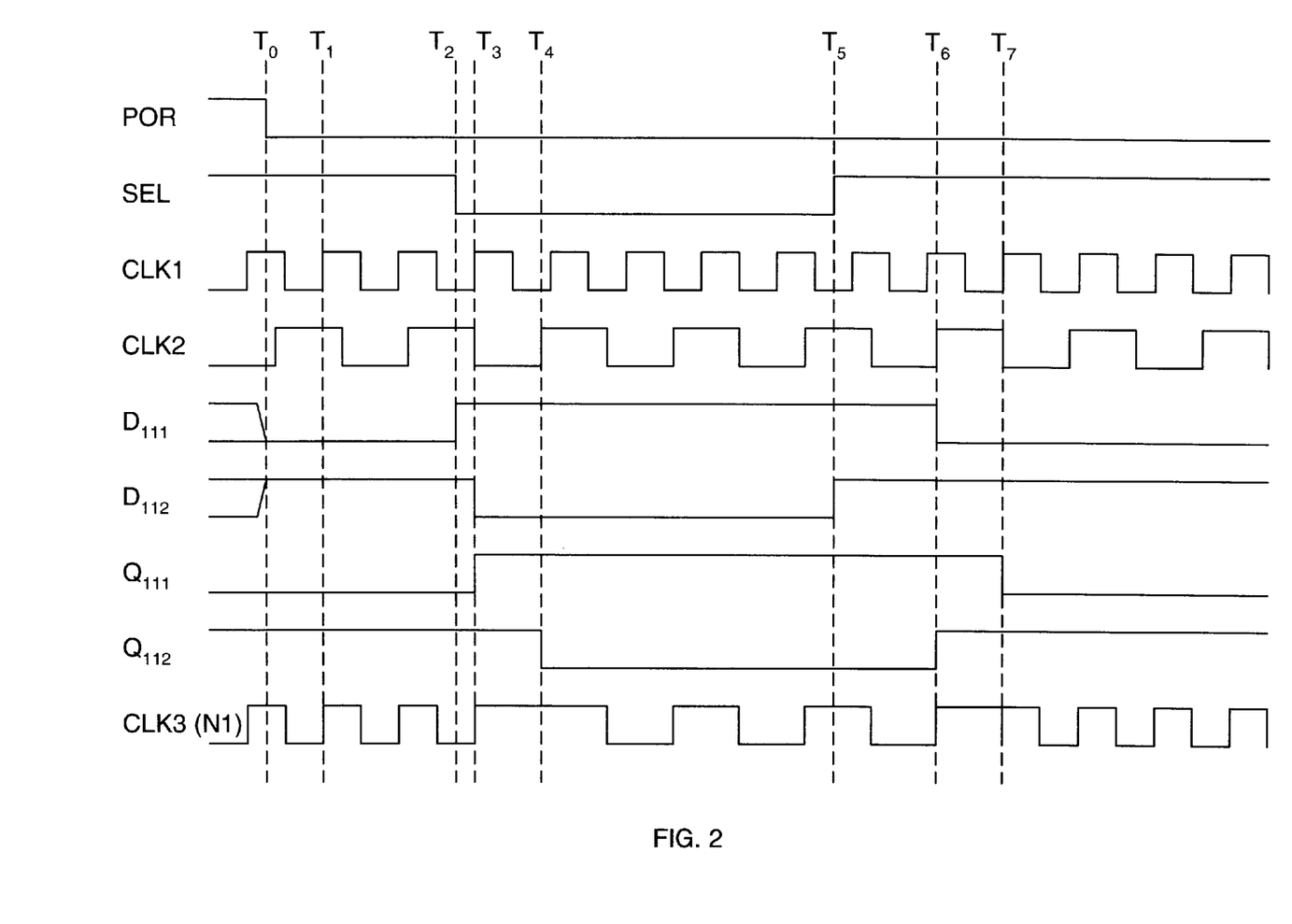
FIG. 2 is a waveform diagram of the timing signals of the clock routing circuit of FIG. 1 when configured to operate in response to the rising edges of the clock signals.

The operation of clock routing circuit 100 will now be described. FIG. 2 is a waveform diagram illustrating the signal timing of clock routing circuit 100 in accordance with one example. Note that signal delays are not represented in FIG. 2. In the waveform diagram of FIG. 2, configuration memory cell 123 is programmed to store a logic "1" configuration data value. As a result, multiplexers 121 and 122 pass the CLK1 and CLK2 signals to flip-flops 111 and 112, respectively.

Prior to time $T_0$, the bus reset signal BusR is in a logic high state (and the BusR# signal is in a logic low state). Flip-flop 111 is reset and flip-flop 112 is set in response to the logic high BusR signal. As a result, flip-flop 111 provides a logic low output signal $Q_{111}$, and flip-flop 112 provides a logic high output signal $Q_{112}$. A logic low POR# signal causes NAND gate 103 to provide a logic high output signal to node N1 and the input terminal of inverter 134. In response, inverter 134 provides a logic low signal to inverter 135, which in turn, provides a logic high CLK3 output signal. However, as described below, the status of node N1 is not determined by keeper circuit 150 at this time, but rather by the CLK1 signal. Note that NAND gate 103 is provided to achieve power savings during the power on process. NAND gate 103 can be replaced with a weak inverter in another embodiment of the present invention.

Prior to time $T_0$, the logic low $Q_{111}$ signal causes inverter 131 to provide a logic high value to the gate of n-channel pass transistor 141. As a result, pass transistor 141 is turned on, thereby routing the primary clock signal CLK1 to node N1 as the CLK3 signal. Note that the CLK1 signal overpowers keeper circuit 150. At this time, the logic high $Q_{112}$ signal causes inverter 132 to provide a logic low value to the gate of transistor 142, thereby turning off this transistor 142.

At time $T_0$, the bus reset signal BusR transitions to a logic low state (and the BusR# signal transitions to a logic high state). The logic low BusR signal "releases" flip-flops 111 and 112, thereby enabling these flip-flops to respond to the applied data and clock signals. The logic high BusR# signal applied to NAND gate 103 causes this NAND gate to operate as an inverter. At this time, NAND gate 103 and inverter 134 maintain the last logic value driven onto node N1, provided that node N1 is not being driven by one of the clock signals CLK1 or CLK2.

In the described example, the clock select signal SEL has a logic high state, thereby indicating that the primary clock signal CLK1 is to be selected. The logic high SEL signal is applied to an input terminal of NAND gate 101. The other input terminal of NAND gate 101 is coupled to receive the logic high $Q_{112}$ signal. As a result, NAND gate 101 provides a logic low signal $D_{111}$ to flip-flop 111. Even though the $D_{111}$ signal has a logic low value, this value is not clocked into flip-flop 111 until the next rising edge of the CLK1 signal.

The logic high SEL signal further causes inverter 133 to provide a logic low signal to an input terminal of NAND gate 102. The other input terminal of NAND gate 102 is coupled to receive the logic low $Q_{111}$ signal. As a result, NAND gate 102 provides a logic high signal $D_{112}$ to flip-flop 112.

At time $T_1$, the CLK1 signal transitions from a logic low state to a logic high state (rising edge), thereby clocking the logic low $D_{111}$ signal into flip-flop 111. When the logic low $D_{111}$ signal is latched into flip-flop 111, the $Q_{111}$ signal remains in a logic low value. In response to the logic low $Q_{111}$ signal, inverter 131 continues to provide a logic high voltage to the gate of pass transistor 141. Thus, pass transistor 141 remains on, thereby enabling the CLK1 signal to pass to node N1 as the CLK3 signal. Note that there are no glitches in the CLK3 signal.

After time $T_1$, clock routing circuit 100 will continue to route the CLK1 signal as the CLK3 output signal until the clock select signal SEL changes states. At time $T_2$, the SEL signal transitions from a logic high state to a logic low state, thereby indicating that the output clock signal CLK3 should be changed from the primary clock signal CLK1 to the secondary clock signal CLK2. In all embodiments described herein, the clock select signal SEL is an asynchronous signal that can be asserted or de-asserted at any time. The logic low SEL signal is applied to an input terminal of NAND gate 101, thereby causing NAND gate 101 to provide a logic high $D_{111}$ signal to flip-flop 111. Note that this logic high $D_{111}$ signal is not latched into flip-flop 111 until the next rising edge of the CLK1 signal. As a result, pass transistor 141 continues to pass the CLK1 signal after time $T_2$.

The logic low SEL signal also causes inverter 133 to provide a logic high value to an input terminal of NAND gate 102. However, because the $Q_{111}$ value still has a logic low value at this time, NAND gate 102 continues to provide a logic high $D_{112}$ signal.

At time $T_3$, the CLK1 signal transitions from a logic low state to a logic high state (rising edge), thereby applying a logic high value to node N1 and clocking the logic high $D_{111}$ signal into flip-flop 111. When the logic high $D_{111}$ signal is latched into flip-flop 111, the $Q_{111}$ signal transitions to a logic high value. In response to the logic high $Q_{111}$ signal, inverter 131 provides a logic low voltage to the gate of pass transistor 141. In response, pass transistor 141 turns off, thereby isolating node N1 from the CLK1 signal. Because the $Q_{112}$ signal also has a logic high value at this time, pass transistor 142 is also non-conducting. Under these conditions, keeper circuit 150 stores the last state driven onto node N1. That is, keeper circuit 150 maintains node N1 at the logic high value applied at the rising edge of the CLK1 signal. The CLK3 signal remains latched at a logic high state until the next rising edge of the CLK2 signal, which occurs at time $T_4$.

Note that an acceptable race condition exists at time $T_3$, wherein the CLK1 signal must transition to a logic high state and be routed through turned on pass transistor 141 before pass transistor 141 is turned off in response to the rising edge of the CLK1 signal.

Also at time $T_3$, the logic high $Q_{111}$ signal is provided to NAND gate 102. Because both inputs to NAND gate 102 are high at this time, NAND gate 102 provides a logic low $D_{112}$ signal to flip-flop 112. However, this logic low $D_{112}$ signal is not latched into flip-flop 112 until the next rising edge of clock signal CLK2.

At time $T_4$, the CLK2 signal transitions from a logic low state to a logic high state (rising edge), thereby clocking the logic low $D_{112}$ signal into flip-flop 112. When the logic low $D_{112}$ signal is latched into flip-flop 112, the $Q_{112}$ signal transitions to a logic low value. In response to the logic low $Q_{112}$ signal, inverter 132 provides a logic high voltage to the gate of pass transistor 142. In response, pass transistor 142 turns on, thereby coupling node N1 to receive the CLK2 signal. As a result, the CLK2 signal is transmitted as the CLK3 signal. Note that there are no glitches in the CLK3 signal because node N1 is held at a logic high value prior to time $T_4$ by keeper circuit 150, and node N1 is coupled to receive the logic high CLK2 signal, which will necessarily have a logic high value after time $T_4$.

After time $T_4$, clock routing circuit 100 will route the CLK2 signal as the CLK3 output signal until the clock select signal SEL changes states. At time $T_5$, the SEL signal transitions from a logic low state to a logic high state, thereby indicating that the output clock signal CLK3 should be changed from the CLK2 signal to the CLK1 signal. The logic high SEL signal causes inverter 133 to provide a logic low signal to an input terminal of NAND gate 102, thereby causing NAND gate 102 to provide a logic high $D_{112}$ signal to flip-flop 112. Note that this logic high $D_{112}$ signal is not latched into flip-flop 112 until the next rising edge of the CLK2 signal. As a result, pass transistor 142 continues to pass the CLK2 signal after time $T_5$.

The logic high SEL signal is also provided to an input terminal of NAND gate 101. However, because the $Q_{112}$ value still has a logic low value at this time, NAND gate 101 continues to provide a logic high $D_{111}$ signal.

At time $T_6$, the CLK2 signal transitions from a logic low state to a logic high state (rising edge), thereby applying a logic high value to node N1 and clocking the logic high $D_{112}$ signal into flip-flop 112. When the logic high $D_{112}$ signal is latched into flip-flop 112, the $Q_{112}$ signal transitions to a logic high value. In response to the logic high $Q_{112}$ signal, inverter 132 provides a logic low voltage to the gate of pass transistor 142. In response, pass transistor 142 turns off, thereby isolating node N1 from the CLK2 signal. Because the $Q_{111}$ signal also has a logic high value at this time, pass transistor 141 is also turned off. Under these conditions, keeper circuit 150 stores the last state driven onto node N1. That is, keeper circuit 150 maintains node N1 at the logic high value applied at the rising edge of the CLK2 signal. The CLK3 signal is maintained at a logic high state until the next rising edge of the CLK1 signal, which occurs at time $T_7$.

Note that an acceptable race condition exists at time $T_6$, wherein the CLK2 signal must transition to a logic high state and be routed through turned on pass transistor 142 before pass transistor 142 is turned off in response to the rising edge of the CLK2 signal.

Also at time $T_6$, the logic high $Q_{111}$ signal is provided to NAND gate 101. Because both inputs to NAND gate 101 are high at this time, NAND gate 101 provides a logic low $D_{111}$ value to flip-flop 111. However, this logic low $D_{111}$ value is not latched into flip-flop 111 until the next rising edge of clock signal CLK1.

At time $T_7$, the CLK1 signal transitions from a logic low state to a logic high state, thereby clocking the logic low $D_{111}$ signal into flip-flop 111. When the logic low $D_{111}$ signal is latched into flip-flop 111, the $Q_{111}$ signal transitions to a logic low value. In response to the logic low $Q_{111}$ signal, inverter 131 provides a logic high voltage to the gate of pass transistor 141. In response, pass transistor 141 turns on, thereby coupling node N1 to receive the CLK1 signal. As a result, the CLK1 signal is transmitted as the CLK3 signal. Note that there are no glitches in the CLK3 signal because node N1 is held at a logic high value prior to time $T_7$ by keeper circuit 150, and node N1 is coupled to receive the logic high CLK1 signal, which will necessarily have a logic high value after time $T_7$.

After time $T_7$, clock routing circuit 100 will route the CLK1 signal as the CLK3 output signal until the clock select signal SEL changes states.

The above described example assumes that configuration memory cell 123 stores a logic "1" value, such that multiplexers 121 and 122 pass the CLK1 and CLK2 signals, respectively, to the clock input terminals of flip-flops 111 and 112, respectively. As described above, this configuration causes flip-flops 111 and 112 to be triggered by the rising edges of the CLK1 and CLK2 signals, respectively. However, if configuration memory cell 123 is programmed to store a logic "0" value, then multiplexers 121 and 122 will pass the inverse of the CLK1 and CLK2 signals to the clock input terminals of flip-flops 111 and 112, respectively. As a result, flip-flops 111 and 112 will be triggered by the falling edges of the CLK1 and CLK2 signals, respectively.

Figure 3:
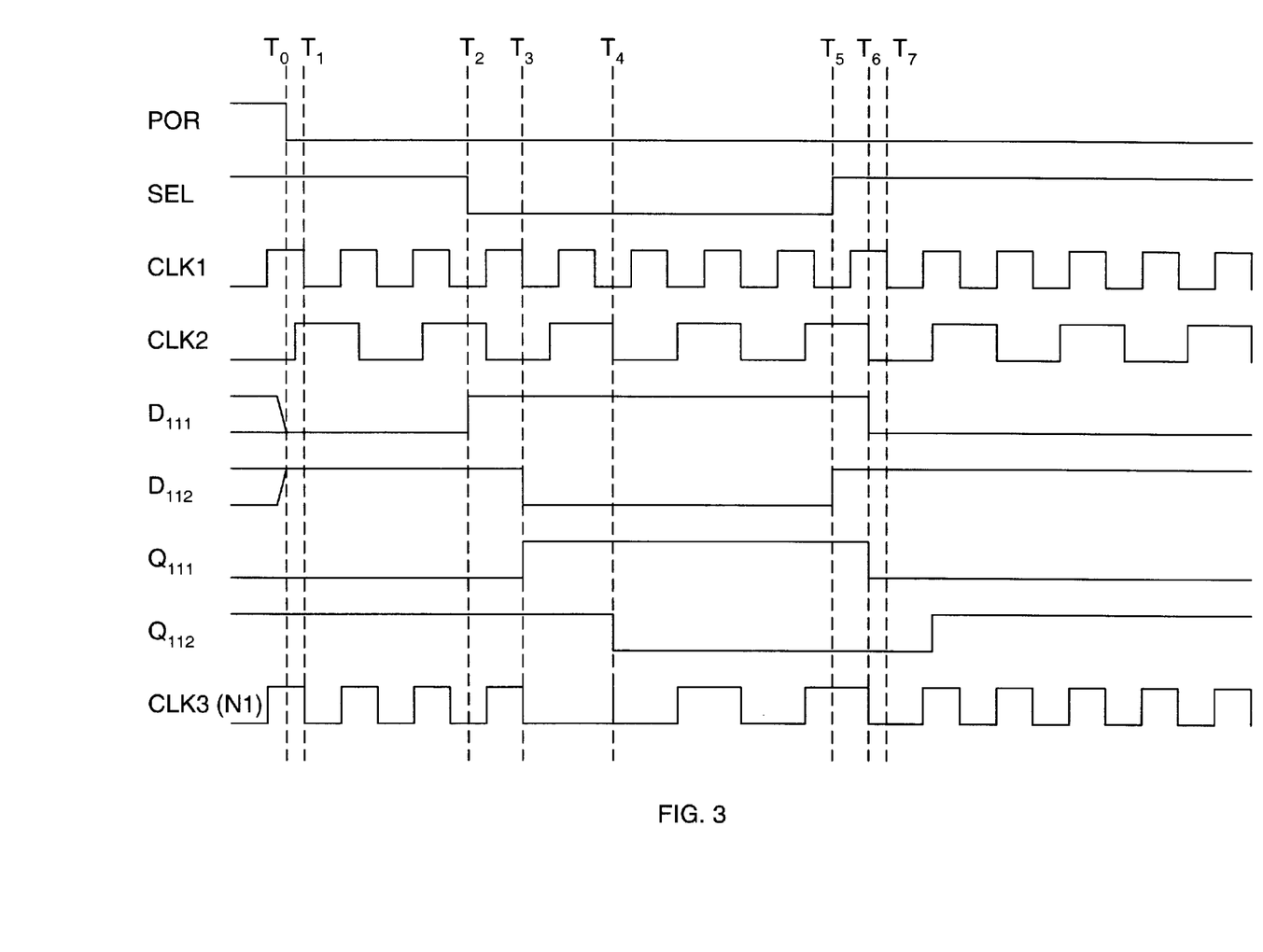
FIG. 3 is a waveform diagram of the timing signals of the clock routing circuit of FIG. 1 when configured to operate in response to the falling edges of the clock signals.

FIG. 3 is a waveform diagram illustrating the signal timing of clock routing circuit 100 when configuration memory cell 123 is programmed to store a logic "0" value. The operation of clock routing circuit 100 when configuration memory cell 123 stores a logic "0" value (FIG. 3) is similar to the operation of clock routing circuit 100 when configuration memory cell 123 stores a logic "1" value (FIG. 2). Thus, only the differences in operation will be described. In FIG. 3, the signal transitions occurring at times $T_1$, $T_3$ and $T_7$ are triggered by falling edges of the CLK1 signal (rather than by rising edges of the CLK1 signal). Similarly, in FIG. 3, the signal transitions occurring at times $T_4$ and $T_6$ are triggered by falling edges of the CLK2 signal (rather than by rising edges of the CLK2 signal). Finally, keeper circuit 150 holds the output clock signal CLK3 at a logic low value from time $T_3$ to time $T_4$, and from time $T_6$ to time $T_7$ (rather than at a logic high value). Again, the configuration of clock routing circuit 100 ensures that no clock glitches occur when switching is performed in response to the falling edges of the CLK1 and CLK2 signals.

In an alternative embodiment of the present invention, a constant value (i.e., either logic "1" or logic "0") is applied in place of the secondary clock signal CLK2. As described below, this configuration causes clock routing circuit 100 to operate as a glitch-free clock gating circuit. A clock gating circuit is a circuit that can be controlled to route either a clock signal or a predetermined constant value.

Figure 4:
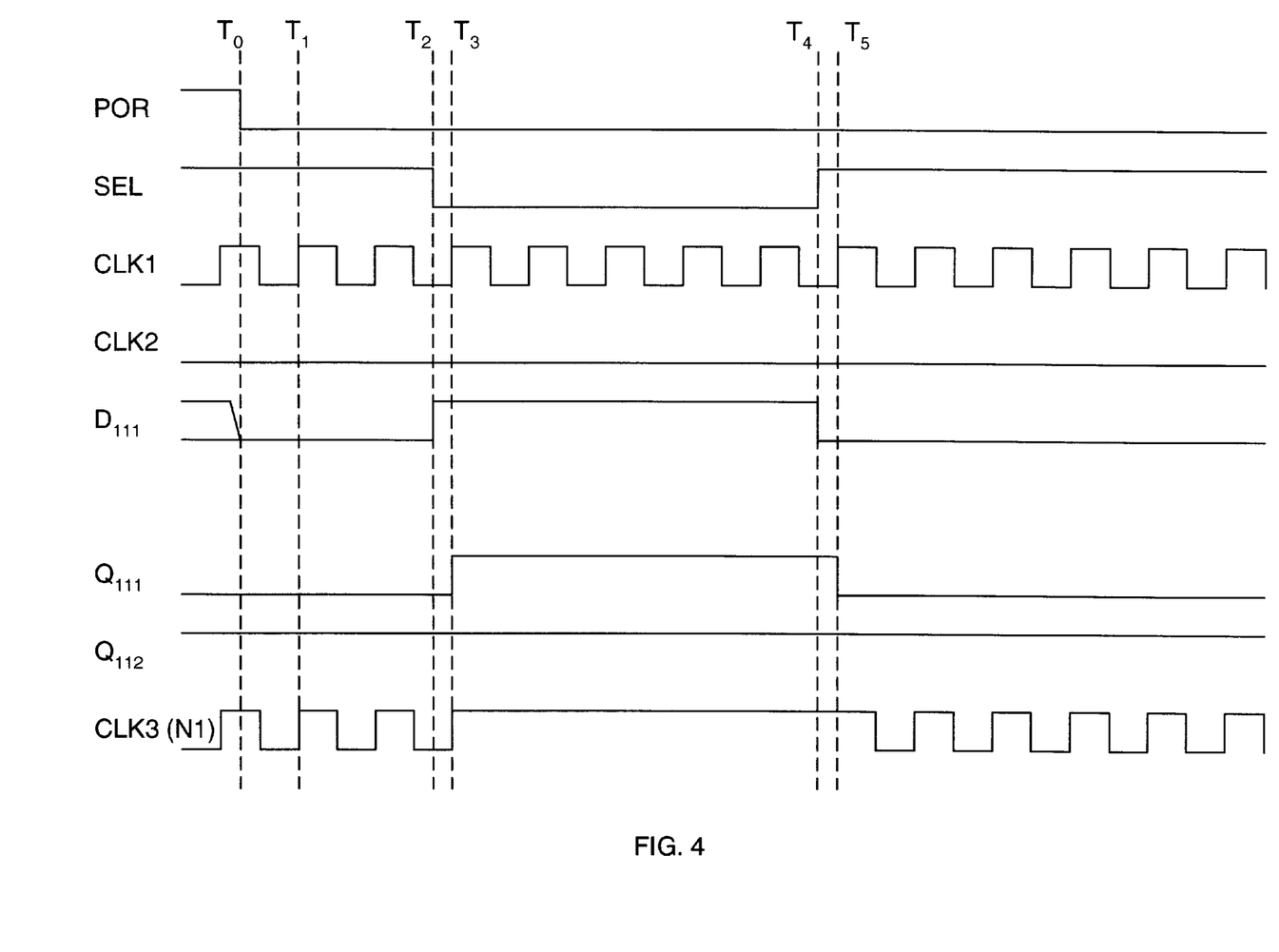
FIG. 4 is a waveform diagram of the timing signals of the clock routing circuit of FIG. 1 when configured to operate as a clock gating circuit in response to rising clock edges.

FIG. 4 is a waveform diagram illustrating signals of clock routing circuit 100, when this circuit is configured to operate as a clock gating circuit. In the present example, the secondary clock signal CLK2 is replaced with a constant logic "0" value, and configuration memory cell 123 is programmed to store a logic "1" value. The logic "1" value stored in configuration memory cell 123 causes the constant logic "0" value of the CLK2 signal to be routed to the clock input terminal of flip-flop 112. Because the signal applied to the clock input terminal of flip-flop 112 does not change states, the $Q_{112}$ output signal provided by flip-flop 112 does not change states. Because the $Q_{112}$ signal is initially set to a logic "1" value in response to the logic high BusR signal, the $Q_{112}$ signal remains at a logic "1" value during the operation of the clock routing circuit 100. Pass transistor 142 is turned off in response to the logic high $Q_{112}$ signal.

The $Q_{111}$ signal is initially reset to a logic "0" value in response to the logic high BusR signal. As a result, pass transistor 141 is turned on, thereby routing the primary clock signal CLK1 as the output clock signal CLK3. In response to the logic "1" value of the $Q_{112}$ signal, NAND gate 101 functions as an inverter which provides a $D_{111}$ signal that is the inverse of the clock select signal SEL. At time $T_0$, the SEL signal has a logic "1" value, thereby causing NAND gate 101 to provide a $D_{111}$ signal having a logic "0" value.

At time $T_1$, the CLK1 signal transitions from a logic low state to a logic high state (rising edge), thereby clocking the logic low $D_{111}$ signal into flip-flop 111. When the logic low $D_{111}$ signal is latched into flip-flop 111, the $Q_{111}$ signal transitions to a logic low value. In response to the logic low $Q_{111}$ signal, inverter 131 continues to provide a logic high voltage to the gate of pass transistor 141. Thus, pass transistor 141 remains turned on, thereby passing the CLK1 signal to node N1 as the CLK3 signal.

After time $T_1$, clock routing circuit 100 will route the CLK1 signal as the CLK3 output signal until the clock select signal SEL changes states. At time $T_2$, the SEL signal transitions from a logic high state to a logic low state, thereby indicating that the output clock signal CLK3 should be changed from the CLK1 signal to a predetermined constant value. The logic low SEL signal is applied to an input terminal of NAND gate 101, thereby causing NAND gate 101 to provide a logic high $D_{111}$ signal to flip-flop 111. Note that this logic high $D_{111}$ signal is not latched into flip-flop 111 until the next rising edge of the CLK1 signal. As a result, pass transistor 141 continues to pass the CLK1 signal after time $T_2$.

At time $T_3$, the CLK1 signal transitions from a logic low state to a logic high state (rising edge), thereby applying a logic high value to node N1 and clocking the logic high $D_{111}$ signal into flip-flop 111. When the logic high $D_{111}$ signal is latched into flip-flop 111, the $Q_{111}$ signal transitions to a logic high value. In response to the logic high $Q_{111}$ signal, inverter 131 provides a logic low voltage to the gate of pass transistor 141. In response, pass transistor 141 turns off, thereby isolating node N1 from the CLK1 signal. Because pass transistor 142 is also turned off, keeper circuit 150 stores the last state driven onto node N1. That is, keeper circuit 150 maintains node N1 at the logic high value applied at the rising edge of the CLK1 signal. The CLK3 signal is maintained at a logic high state until after the SEL signal transitions to a logic "1" value.

At time $T_4$, the SEL signal transitions from a logic low state to a logic high state, thereby indicating that the output clock signal CLK3 should be changed from the predetermined constant value to the CLK1 signal. The logic high SEL signal is applied to an input terminal of NAND gate 101, thereby causing NAND gate 101 to provide a logic low $D_{111}$ signal to flip-flop 111. Note that this logic low $D_{111}$ signal is not latched into flip-flop 111 until the next rising edge of the CLK1 signal. As a result, keeper circuit 150 continues to maintain the logic high value on node N1.

At time $T_5$, the CLK1 signal transitions from a logic low state to a logic high state (rising edge), thereby applying a logic high value to node N1 and clocking the logic low $D_{111}$ signal into flip-flop 111. When the logic low $D_{111}$ signal is latched into flip-flop 111, the $Q_{111}$ signal transitions to a logic low value. In response to the logic low $Q_{111}$ signal, inverter 131 provides a logic high voltage to the gate of pass transistor 141. In response, pass transistor 141 turns on, thereby routing the CLK1 signal to node N1. As a result, the CLK1 signal is transmitted as the CLK3 signal. Note that there are no glitches in the CLK3 signal because node N1 is held at a logic high value prior to time $T_5$ by keeper circuit 150, and node N1 is coupled to receive the logic high CLK1 signal, which will necessarily have a logic high value after time $T_5$.

Note that there are no glitches in the CLK3 signal because node N1 is held at a logic high value prior to time $T_5$ by keeper circuit 150, and node N1 is coupled to receive the logic high CLK1 signal, which will necessarily have a logic high value after time $T_5$.

The above described example assumes that configuration memory cell 123 stores a logic "1" value, such that multiplexer 121 passes the CLK1 signal to the clock input terminal of flip-flop 111. As described above, this configuration causes flip-flop 111 to be triggered by the rising edge of the CLK1 signal. However, if configuration memory cell 123 is programmed to store a logic "0" value, then multiplexer 121 will pass the inverse of the CLK1 signal to the clock input terminal of flip-flop 111. As a result, flip-flop 111 will be triggered by the falling edges of the CLK1 signal.

Figure 5:
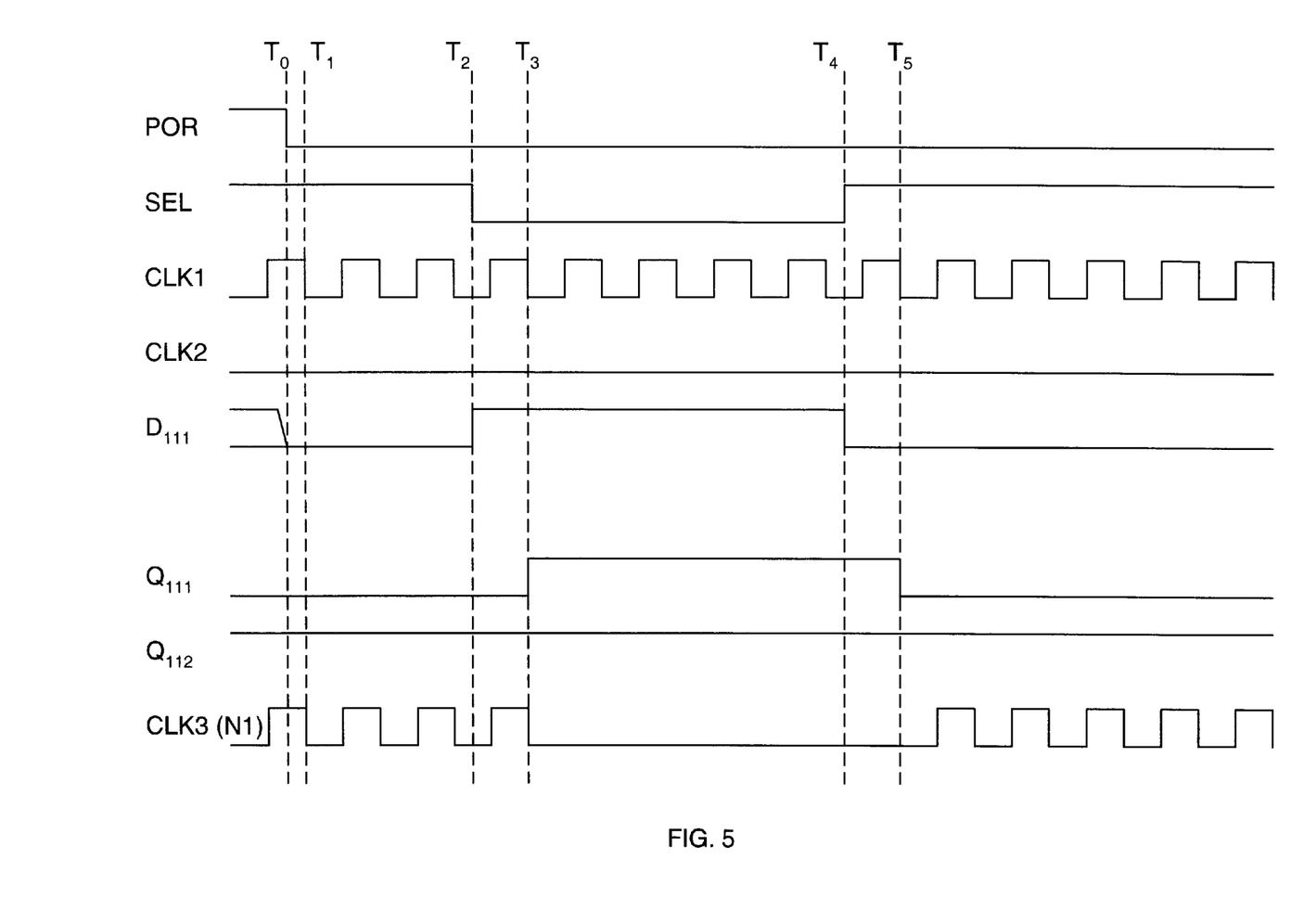
FIG. 5 is a waveform diagram of the timing signals of the clock routing circuit of FIG. 1 when configured to operate as a clock gating circuit in response to falling clock edges.

FIG. 5 is a waveform diagram illustrating the signal timing of clock routing circuit 100 when configuration memory cell 123 is programmed to store a logic "0" value. The operation clock routing circuit 100 when configuration memory cell 123 stores a logic "0" value (FIG. 5) is similar to the operation of clock routing circuit 100 when configuration memory cell 123 stores a logic "1" value (FIG. 4). Thus, only the differences in operation will be described. In FIG. 5, the signal transitions occurring at times $T_1$, $T_3$ and $T_5$ are triggered by falling edges of the CLK1 signal (rather than by rising edges of the CLK1 signal). In addition, keeper circuit 150 holds the output clock signal CLK3 at a logic low value from time $T_3$ to time $T_5$ (rather than at a logic high value). Again, the configuration of clock routing circuit 100 ensures that no clock glitches occur when switching is performed in response to the falling edges of the CLK1 signal.

Figure 6:
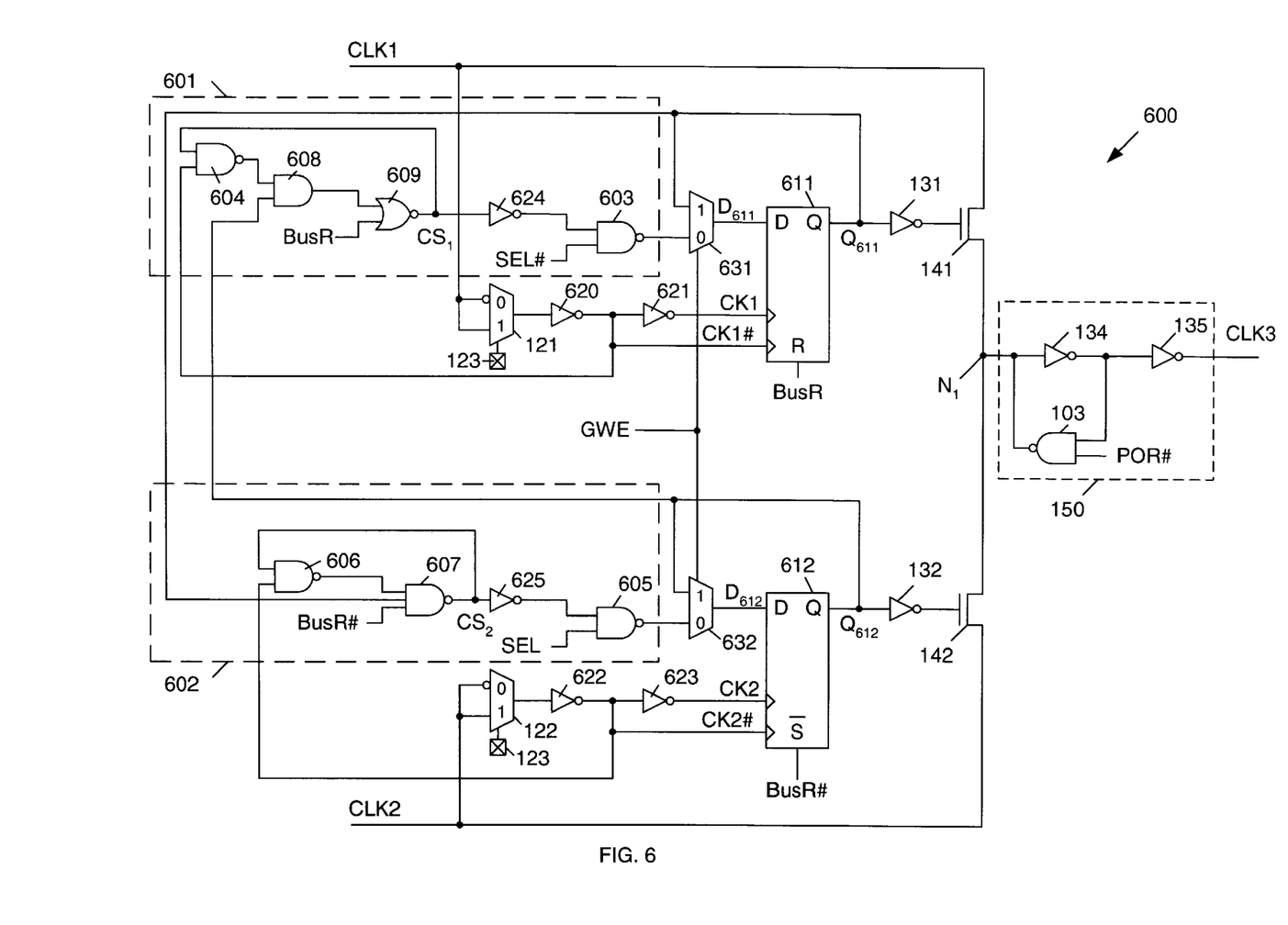
FIG. 6 is a schematic diagram of a clock routing circuit in accordance with another embodiment of the present invention.

FIG. 6 is a schematic diagram of clock routing circuit 600 in accordance with another embodiment of the present invention. While clock routing circuit 600 can be used for any type of integrated circuit, it is noted that clock routing circuit 600 is particularly intended for implementation on an FPGA. Because clock routing circuit 600 is similar to clock routing circuit 100 (FIG. 1), similar elements in FIGS. 1 and 6 are labeled with similar reference numbers. Thus, FIG. 6 includes multiplexers 121–122, configuration memory cell 123, inverters 131–132, n-channel pass transistors 141–142, and keeper circuit 150.

In addition, clock routing circuit 600 includes clock switching circuits 601–602, latches 611–612, inverters 620–623 and 2-to-1 multiplexers 631–632. Clock switching circuits 601–602 include NAND gates 603–607, AND gate 608, NOR gate 609 and inverters 624–625, which are connected as illustrated. As described in more detail below, clock switching circuits 601–602 control transitions of the CLK3 output signal between the CLK1 signal and the CLK2 signal.

Inverters 620–621 are coupled in series between the output terminal of multiplexer 121 and a first clock input terminal of latch 611, thereby providing the clock signal routed by multiplexer 121 (hereinafter referred to as clock signal CK1) to latch 611. Inverter 620 provides the inverse of clock signal CK1 (hereinafter referred to as clock signal CK1#) to a second clock input terminal of latch 611 and to an input terminal of NAND gate 604.

Similarly, inverters 622–623 are coupled in series between the output terminal of multiplexer 122 and a first clock input terminal of latch 612, thereby providing the clock signal routed by multiplexer 122 (hereinafter referred to as clock signal CK2) to latch 612. Inverter 622 provides the inverse of clock signal CK2 (hereinafter referred to as clock signal CK2#) to a second clock input terminal of latch 612 and to an input terminal of NAND gate 606.

Multiplexers 631 and 632 have "1" input terminals coupled to the Q output terminals of latches 611 and 612, respectively. In addition, multiplexers 631 and 632 have "0" input terminals coupled to receive control signals from clock switching circuits 601 and 602, respectively. Multiplexers 631 and 632 are controlled by a global write enable signal GWE. When the GWE signal has a logic "1" state, multiplexers 631 and 632 route the $Q_{611}$ and $Q_{612}$ signals from the Q output terminals of latches 611 and 612, respectively, as the $D_{611}$, and $D_{612}$ signals to the D input terminals of latches 611 and 612, respectively. As a result, the $Q_{611}$ and $Q_{612}$ output signals of latches 611–612 are simply retained in these latches 611–612, such that the $Q_{611}$ and $Q_{612}$ output signals do not change while the GWE signal has a logic "1" value. Under these conditions, the clock signal (i.e., CLK1 or CLK2) that is being routed as the CLK3 output signal when the GWE signal transitions to a logic "1" value continues to be routed as the CLK3 output signal until after the GWE signal transitions to a logic "0" value. In this manner, the GWE signal can be used to "hold" the selection of the CLK3 signal. In an alternate embodiment, both the GWE signal and the complement of the GWE signal are provided to control each of multiplexers 631 and 632.

In general, clock routing circuit 600 drives the output clock signal CLK3 using primary clock signal CLK1 or secondary clock signal CLK2, in response to a select signal SEL. A SEL signal having a logic "0" value indicates that primary clock signal CLK1 is to drive output clock signal CLK3 and a SEL signal having a logic "1" value indicates that secondary clock signal CLK2 is to drive output clock signal CLK3.

When the primary clock signal CLK1 is driving the output clock signal CLK3 and the select signal SEL transitions to a logic "1" value, clock routing circuit 600 stops driving the primary clock signal CLK1 as soon as the primary clock signal CLK1 has a logic "0" value. Thus, if the primary clock signal CLK1 has a logic "0" value when the select signal SEL transitions to a logic "1" value, then the primary clock signal CLK1 stops driving the output clock signal CLK3 immediately. Note that setup time requirements must be met in this instance. If the primary clock signal CLK1 has a logic "1" value when the select signal SEL transitions to a logic "0" value, then the primary clock signal CLK1 continues to drive the output clock signal CLK3 until the primary clock signal CLK1 transitions to a logic "0" value. When the primary clock signal CLK1 stops driving the output clock signal CLK3, keeper circuit 150 maintains the last logic value of the output clock signal CLK3 (i.e., a logic "0" value in this circumstance). Stated another way, as soon as the SEL signal transitions to a logic "1" value, the next relevant edge of the primary clock signal CLK1 (i.e., the next rising edge) is prevented from being routed as the output clock signal CLK3.

Once the primary clock signal CLK1 stops driving the output clock signal CLK3, clock routing circuit 600 causes the secondary clock signal CLK2 to drive the output clock signal CLK3 when the secondary clock signal CLK2 transitions to a logic "0" value. Thus, if secondary clock signal CLK2 has a logic "1" value when primary clock signal CLK1 stops driving output clock signal CLK3, then clock routing circuit 600 begins driving secondary clock signal CLK2 to output clock signal CLK3 when secondary clock signal CLK2 transitions to a logic "0" value. Similarly, if secondary clock signal CLK2 has a logic "0" value when primary clock signal CLK1 stops driving output clock signal CLK3, then clock routing circuit 600 begins driving secondary clock signal CLK2 to output clock signal CLK3 when secondary clock signal CLK2 transitions to a logic "0" value after first transitioning to a logic "1" value. This guarantees that the output clock signal CLK3 remains low for at least as long as the secondary clock signal CLK2, thereby preventing a short pulse during the transition.

Conversely, when the SEL signal transitions from a logic "1" value to a logic "0" value, a similar process is performed to transition from the secondary clock signal CLK2 driving the output clock signal CLK3 to the primary clock signal CLK1 driving the output clock signal CLK3.

To summarize, clock routing circuit 600 provides fast, glitchless switching between two clock signals by routing the primary clock signal until the primary clock signal has a logic "0" value (i.e., the primary clock signal is low) and then routing the secondary clock signal when the secondary clock signal goes to a logic "0" value (i.e., the secondary clock signal goes low). By sequencing the transition between the primary clock signal and the secondary clock signal in this manner, clock signal glitches and disturbances are eliminated. Again, this sequence guarantees that the output clock signal CLK3 will remain low for at least as long as the secondary clock signal CLK2, thereby preventing a short pulse during the transition. Note that the transition level (high or low) of the primary and secondary clock signals may be modified by changing the value stored in configuration memory cell 123 (FIG. 6).

Figure 7:
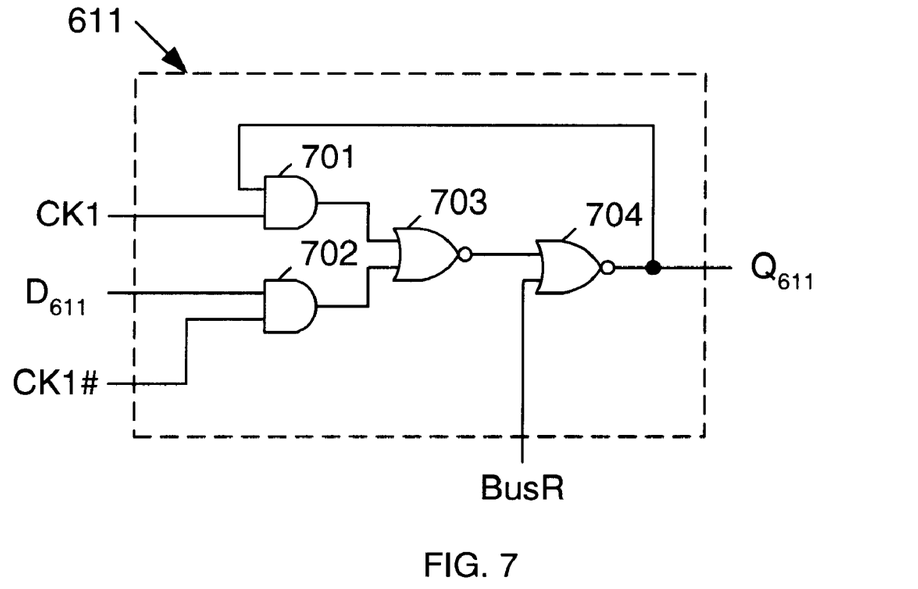
FIG. 7 is a circuit diagram of a first latch used in the clock routing circuit of FIG. 6 in accordance with one embodiment of the present invention.

FIG. 7 is a circuit diagram of latch 611 in accordance with one embodiment of the present invention. Latch 611 includes AND gates 701–702 and NOR gates 703–704. AND gate 701 provides a signal to NOR gate 703 in response to the $Q_{611}$ output signal and the CK1 signal. Similarly, AND gate 702 provides a signal to NOR gate 703 in response to the $D_{611}$ input signal and the CK1# signal. NOR gate 704 provides the $Q_{611}$ output signal in response to the BusR signal and the output signal provided by NOR gate 703.

Figure 8:
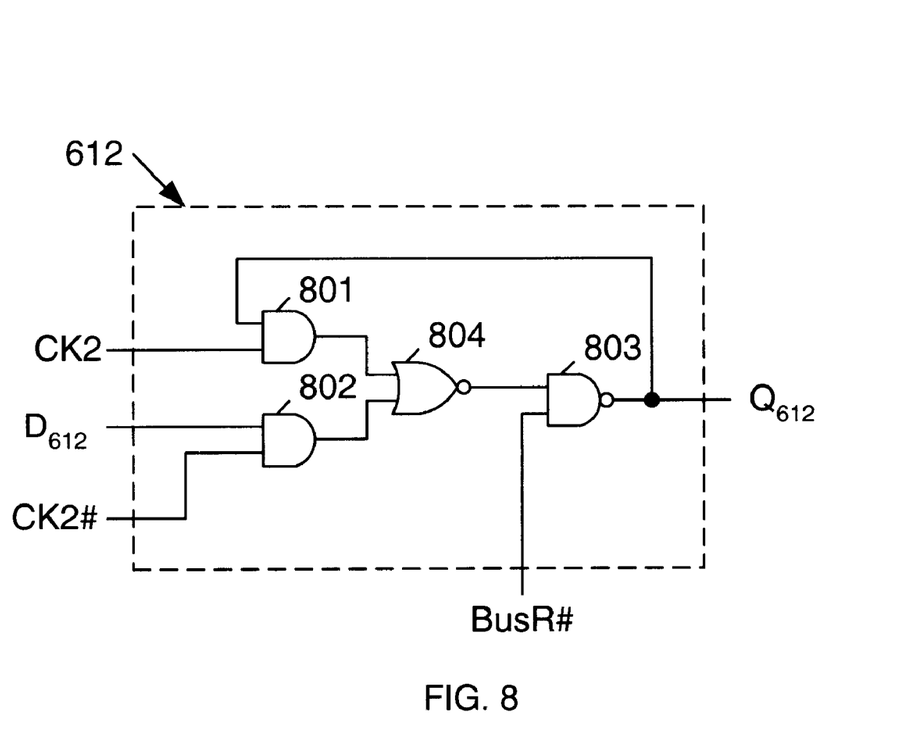
FIG. 8 is a circuit diagram of a second latch used in the clock routing circuit of FIG. 6 in accordance with one embodiment of the present invention.

FIG. 8 is a circuit diagram of latch 612 in accordance with one embodiment of the present invention. Latch 612 includes AND gates 801–802, NAND gate 803 and NOR gate 804. AND gate 801 provides a signal to NOR gate 804 in response to the $Q_{612}$ output signal and the CK2 signal. Similarly, AND gate 802 provides an input signal to NOR gate 804 in response to the $D_{612}$ input signal and the CK2# signal. NAND gate 803 provides the $Q_{612}$ output signal in response to the BusR# signal and the output signal provided by NOR gate 804. The operation of latches 611–612 is described in more detail below.

Figure 9:
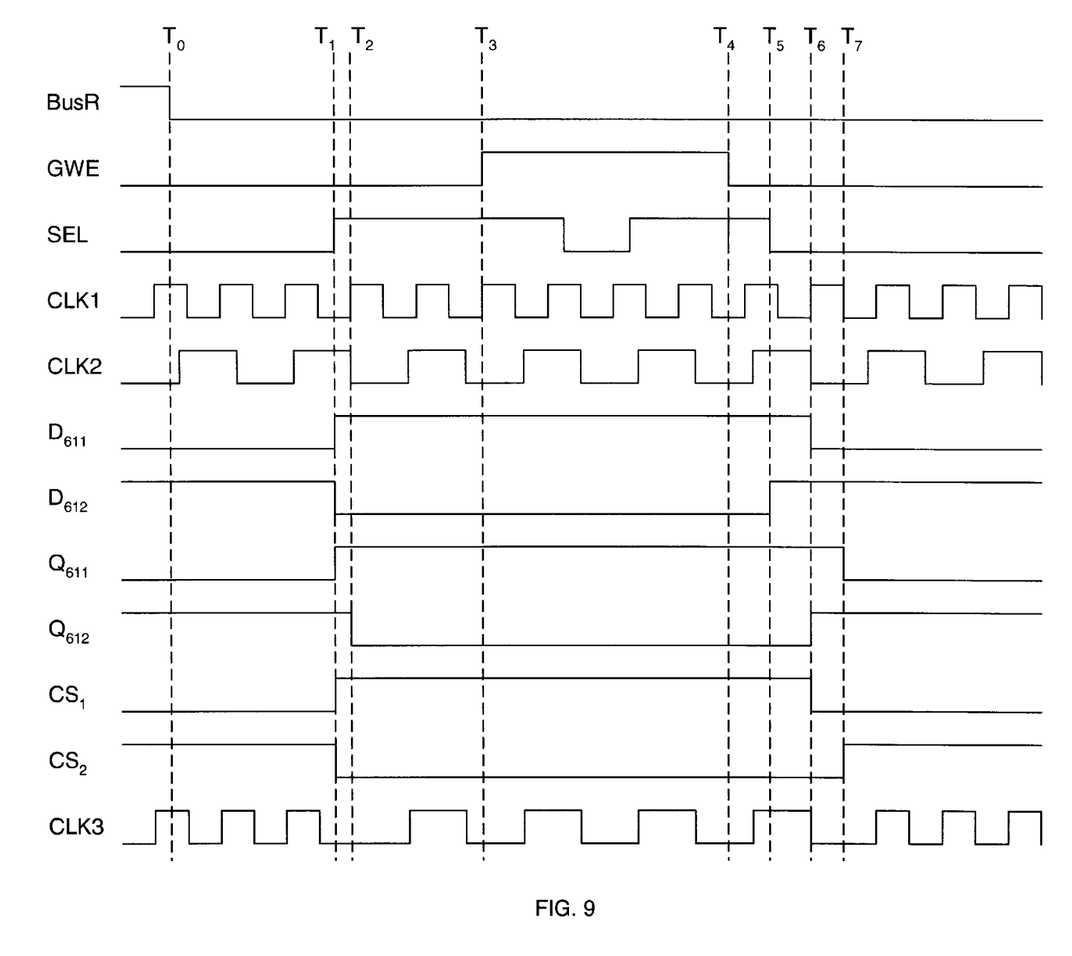
FIG. 9 is a waveform diagram of the timing signals of the clock routing circuit of FIG. 6 when configured to operate in response to the rising edges of the clock signals.

FIG. 9 is a waveform diagram illustrating the operation of circuit 600 in accordance with one embodiment of the present invention. In this example, configuration memory cell 123 is programmed to store a logic "1" value, such that multiplexers 121 and 122 are configured to pass the CLK1 and CLK2 signals as the CK1 and CK2 signals, respectively.

Prior to time $T_0$, the BusR signal is asserted high (and the complementary BusR# signal is asserted low). In addition, the SEL signal has a logic low value (and the complementary SEL# signal has a logic high value). The GWE signal has a logic "0" value, such that the $D_{611}$ and $D_{612}$ signals are provided by NAND gates 603 and 605, respectively.

The logic low BusR# signal causes NAND gate 607 to provide a logic high control signal $CS_2$. The logic high control signal $CS_2$ causes NAND gate 605 to provide a logic high $D_{612}$ input signal. (The logic low SEL signal would also cause NAND gate 605 to provide a logic high $D_{612}$ input signal.) The logic high BusR signal causes NOR gate 609 to provide a logic low control signal $CS_1$. In response, to the logic low control signal $CS_1$ and the logic high SEL# signal, NAND gate 603 provides a logic low $D_{611}$ input signal.

The logic high BusR signal also causes latch 611 to provide a logic low $Q_{611}$ output signal (see, NOR gate 704, FIG. 7). The logic low BusR# signal causes latch 612 to provide a logic high $Q_{612}$ output signal (see, NAND gate 803, FIG. 8). As a result, pass transistor 141 is turned on (and pass transistor 142 is turned off) prior to time $T_0$, thereby causing the primary clock signal CLK1 to be routed as the output clock signal CLK3.

At time $T_0$, the BusR signal is de-asserted low, thereby enabling latch 611 to operate in response to the $D_{611}$, $Q_{611}$, CK1 and CK1# signals, and enabling latch 612 to operate in response to the $D_{612}$, $Q_{612}$, CK2 and CK2# signals. Also at time $T_0$, the POR# signal (if previously asserted low) is de-asserted high, thereby enabling keeper circuit 150. At this time, clock routing circuit 600 is controlled by the select signal SEL. In the described example, the SEL signal is initially set to a logic low value, thereby selecting the primary clock signal CLK1 to be routed as the output clock signal CLK3. Within clock switch circuit 602, the logic low SEL signal causes NAND gate 605 to continue to provide a logic high $D_{612}$ input signal. Within latch 612 (FIG. 8), the logic high $D_{612}$ and $Q_{612}$ signals ensure that one of AND gates 801–802 provides a logic high output signal to NOR gate 804. In response, NOR gate 804 provides a logic low signal to NAND gate 803, thereby causing NAND gate 803 to continue providing a logic high $Q_{612}$ output signal. Also within clock switch circuit 602, the logic "0" $Q_{611}$ signal causes NAND gate 607 to continue to provide a logic high control signal $CS_2$.

Within clock switch circuit 601, the logic low $CS_1$ control signal causes NAND gate 604 to provide a logic high signal to one input terminal of AND gate 608. The other input terminal of AND gate 608 is coupled to receive the logic high $Q_{612}$ signal. As a result, AND gate 608 provides a logic high signal to NOR gate 609, thereby causing NOR gate 609 to continue providing the logic low $CS_1$ control signal. The logic low $CS_1$ control signal, combined with the logic high SEL# signal, causes NAND gate 603 to continue providing a logic low $D_{611}$ input signal. Within latch 611 (FIG. 8), the logic low D611 and Q611 signals ensure that both of AND gates 701 and 702 provide logic low output signals to NOR gate 703. In response, NOR gate 703 provides a logic high output signal to NOR gate 704. As a result, NOR gate 704 continues providing the logic low $Q_{611}$ output signal, regardless of the states of the CK1 and CK1# signals. Consequently, pass transistor 141 remains on, thereby routing the primary clock signal CLK1 as the output clock signal CLK3.

At time $T_1$, the select signal SEL transitions to a logic high state, thereby indicating that the secondary clock signal CLK2 should be routed as the output clock signal CLK3. At time $T_1$, the clock signal CK1 has a logic low state and the clock signal CK1# has a logic high state (however this is not required). The logic low SEL# signal causes NAND gate 603 to provide a logic high $D_{611}$ input signal to latch 611. Within latch 611, the logic high $D_{611}$ input signal and the logic high CK1# signal cause AND gate 702 to provide a logic high signal to NOR gate 703. In response, NOR gate 703 provides a logic low signal to NOR gate 704, thereby causing NOR gate 704 to provide a logic high $Q_{611}$ output signal. Pass transistor 141 is turned off in response to this logic high $Q_{611}$ output signal. At this time, keeper circuit 150 maintains the last value of the primary clock signal CLK1 (i.e., a logic low value) on node N1. Advantageously, transistor 141 is turned off relatively quickly in this case, without having to wait for a rising or falling clock edge.

Within clock switch circuit 602, the logic high $Q_{611}$ signal is provided to NAND gate 607. At time $T_1$, the secondary clock signal CLK2 has a logic high value (although this is not required), such that the CK2# signal has a logic low value. As a result, NAND gate 606 provides a logic high output signal. At this time, all of the input signals to NAND gate 607 have logic high values. As a result, NAND gate 607 provides a logic low $CS_2$ control signal. In response to the logic low $CS_2$ control signal and the logic high SEL signal, NAND gate 605 provides a logic low $D_{612}$ input signal to latch 612.

Within latch 612, the logic low $D_{612}$ input signal causes AND gate 802 to provide a logic low output signal to NOR gate 804. However, the logic high CK2 clock signal and the logic high $Q_{612}$ output signal cause AND gate 801 to provide a logic high output signal. As a result, the $Q_{612}$ output signal remains high at this time, thereby causing pass transistor 142 to remain off. Consequently, the secondary clock signal CLK2 is not yet routed as the output clock signal CLK3.

NAND gate 606 further provides a logic high output signal in response to the logic low $CS_2$ control signal. As a result, NAND gate 606 will continue to provide a logic high output signal, regardless of the value of the secondary clock signal CLK2. Thus, NAND gate 607 will continue to provide a logic low $CS_2$ control signal as long as the $Q_{611}$ output signal remains high.

At time $T_2$, the CLK2 signal transitions to a logic low state (i.e., CK2="0"; CK2#="1"). Within latch 612, the logic low CK2 signal causes AND gate 801 to provide a logic low output signal to NOR gate 804. In response, NOR gate 804 provides a logic high output signal to NAND gate 803. As a result, NAND gate 803 provides a logic low $Q_{612}$ output signal. The logic low $Q_{612}$ output signal causes pass transistor 142 to turn on, thereby passing the secondary clock signal CLK2 as the output clock signal CLK3. Because the secondary clock signal CLK2 necessarily has a logic low value at this time, and keeper circuit 150 is storing a logic low value, no glitches occur in the output clock signal CLK3.

Note that there is a relatively small time required to switch the output clock signal CLK3 from the primary clock signal CLK1 to the secondary clock signal CLK2. Under worst case conditions, the SEL signal is asserted high right after the primary clock signal CLK1 has transitioned to a logic high state. In this case, the $Q_{611}$ output signal will not transition to a logic high state until the primary clock signal CLK1 transitions to a logic low state one half cycle later. If the secondary clock signal CLK2 transitions to a logic low state right before the $Q_{611}$ output signal transitions to a logic high state, then the $Q_{612}$ output signal will not transition to a logic low state until the next falling edge of the secondary clock signal CLK2, which occurs one cycle of the CLK2 signal later. Thus, under worst case conditions, it takes one half cycle of the primary clock signal CLK1 and one cycle of the secondary clock signal CLK2 to transition from the primary clock signal CLK1 to the secondary clock signal CLK2.

At time $T_3$, the GWE signal is asserted high, thereby causing the logic low $Q_{612}$ signal to be provided as the $D_{612}$ signal, and the logic high $Q_{611}$ signal to be provided as the $D_{611}$ signal.

Within latch 611, the logic high $Q_{611}$ and $D_{611}$ signals cause at least one of AND gates 701–702 to provide a logic high output signal at all times. As a result, the $Q_{611}$ output signal is maintained at a logic high value, regardless of the state of the SEL signal.

Within latch 612, the logic low $Q_{612}$ and $D_{612}$ signals cause AND gates 801 and 802 to provide logic low output signals. As a result, the $Q_{612}$ signal is maintained at a logic low value, regardless of the state of the SEL signal.

At time $T_4$, the GWE signal is de-asserted low, thereby causing NAND gates 603 and 605 to provide the $D_{611}$ and $D_{612}$ input signals to latches 611 and 612, respectively. At this time, clock routing circuit 600 again becomes responsive to the SEL signal.

At time $T_5$, the SEL signal transitions to a logic low value, indicating that the primary clock signal CLK1 should again be routed as the output clock signal CLK3. The logic low SEL signal causes NAND gate 605 to provide a logic high $D_{612}$ input signal. Within latch 612, this logic high $D_{612}$ signal is provided to AND gate 802.

At time $T_6$, the secondary clock signal CLK2 transitions to a logic low state, thereby causing the CK2# signal to go high. Within latch 612, the logic high $D_{612}$ input signal and the logic high CK2# signal cause AND gate 802 to provide a logic high signal to NOR gate 804. In response, NOR gate 804 provides a logic low signal to NAND gate 803, thereby causing NAND gate 803 to provide a logic high $Q_{612}$ output signal. Pass transistor 142 is turned off in response to this logic high $Q_{612}$ output signal. At this time, keeper circuit 150 maintains the last value of the secondary clock signal CLK2 (i.e., a logic low value) on node N1.

Within clock switch circuit 601, the logic high $Q_{612}$ signal is provided to AND gate 608. At time $T_6$, the primary clock signal CLK1 has a logic high value (although this is not required), such that the CK1# signal has a logic low value. As a result, NAND gate 604 provides a logic high output signal to AND gate 608. In response, AND gate 608 provides a logic high output signal, thereby causing the $CS_1$ control signal to transition to a logic low state. NAND gate 604 will continue to provide a logic high output signal in response to the logic low $CS_1$ control signal, regardless of the value of the primary clock signal CLK1. As a result, NOR gate 609 will continue to provide a logic low $CS_1$ control signal as long as the $Q_{612}$ output signal remains high.

In response to the logic low $CS_1$ control signal, NAND gate 603 provides a logic low $D_{611}$ input signal to latch 611. Within latch 611, the logic low $D_{611}$ input signal causes AND gate 702 to provide a logic low output signal to NOR gate 703. However, the logic high $Q_{611}$ output signal and the logic high CK1 signal cause AND gate 701 to provide a logic high output signal to NOR gate 703. As a result, NOR gate 703 continues to provide a logic low output signal, and the $Q_{611}$ output signal remains at a logic high state. Consequently, pass transistor 141 remains off, and keeper circuit 150 maintains a logic low state on node N1.

At time $T_7$, the primary clock signal CLK1 transitions to a logic low state, thereby causing the CK1 signal to go low. Within latch 611, this low CK1 signal causes AND gate 701 to provide a logic low output signal to NOR gate 703. At this time, AND gate 702 continues to provide a logic low output signal to NOR gate 703 in response to the logic low $D_{611}$ input signal. As a result, NOR gate 703 provides a logic high signal to NOR gate 704, thereby causing NOR gate 704 to provide a logic low $Q_{611}$ output signal. This logic low $Q_{611}$ output signal causes pass transistor 141 to turn on, thereby routing the primary clock signal CLK1 as the output clock signal CLK3. Because the primary clock signal CLK1 necessarily has a logic low value at this time, and keeper circuit 150 is storing a logic low value, no glitches occur in the output clock signal CLK3.

Also at time $T_7$, the logic low $Q_{611}$ signal is provided to NAND gate 607 in clock switch circuit 602, thereby causing the $CS_2$ control signal to transition to a logic high state.

In the foregoing manner, clock routing circuit 600 enables output clock signal CLK3 to be switched between the primary clock signal CLK1 and the secondary clock signal CLK2 in a relatively fast, glitchless manner.

Although the invention has been described in connection with several embodiments, it is understood that this invention is not limited to the embodiments disclosed, but is capable of various modifications that would be apparent to a person skilled in the art. For example, additional circuitry can be added to clock routing circuit 600 to improve the pull-up voltage on node N1. In one embodiment, this additional circuitry includes a pair of p-channel pass transistors. One of these p-channel pass transistors is connected in parallel with n-channel pass transistor 141 between node N1 and the terminal receiving the CLK1 signal. The gate of this first p-channel pass transistor is coupled to receive the $Q_{611}$ signal. This first p-channel pass transistor helps node N1 to be pulled up to the full $V_{cc}$ supply voltage in response to the CLK1 signal. The other p-channel pass transistor is connected in parallel with n-channel pass transistor 142 between node N1 and the terminal receiving the CLK2 signal. The gate of this second p-channel pass transistor is coupled to receive the $Q_{612}$ signal. This second p-channel pass transistor helps node N1 to be pulled up to the full $V_{cc}$ supply voltage in response to the CLK2 signal. Thus, the invention is limited only by the following claims.

What is claimed is:

1. A method of routing a first clock signal or a second clock signal as an output clock signal in response to a select signal, the method comprising the steps of:

routing the first clock signal as the output clock signal when the select signal has a first state;

causing the select signal to transition to a second state at time $T_A$;

preventing the first clock signal from being routed as the output clock signal at time $T_B$, wherein time $T_B$ is the first time that the first clock signal has a predetermined logic state after time $T_A$;

holding the output clock signal at the predetermined logic state at time $T_B$; and then routing the second clock signal as the output clock signal the first time that the second clock signal transitions to the predetermined logic state after time $T_B$.

2. The method of claim 1, wherein the first clock signal, the second clock signal and the select signal are asynchronous.

3. The method of claim 1, further comprising the step of programmably selecting the predetermined logic state.

4. The method of claim 1, further comprising the step of replacing the second clock signal with a signal having the predetermined logic state.

5. The method of claim 1, further comprising the steps of:

causing the select signal to transition to the first state at time $T_C$;

preventing the second clock signal from being routed as the output clock signal at time $T_D$, wherein time $T_D$ is first time that the second clock signal has the predetermined logic state after time $T_C$;

holding the output clock signal at the predetermined logic state at time $T_D$; and then routing the first clock signal as the output clock signal the first time that the first clock signal transitions to the predetermined logic state after time $T_D$.

6. The method of claim 1, further comprising the step of programming a configuration memory cell to select the predetermined logic state.

7. A clock routing circuit comprising:

means for routing a first clock signal as an output clock signal when a select signal has a first state;

means for causing the select signal to transition to a second state at time $T_A$;

means for preventing the first clock signal from being routed as the output clock signal at time $T_B$, wherein time $T_B$ is first time that the first clock signal has a predetermined logic state after time $T_A$;

means for holding the output clock signal at the predetermined logic state at time $T_B$; and means for routing the second clock signal as the output clock signal the first time that the second clock signal transitions to the predetermined logic state after time $T_B$.

8. The clock routing circuit of claim 7, further comprising:

means for causing the select signal to transition to the first state at time $T_C$;

means for preventing the second clock signal from being routed as the output clock signal at time $T_D$, wherein time $T_D$ is first time that the second clock signal has the predetermined logic state after time $T_C$;

means for holding the output clock signal at the predetermined logic state at time $T_D$; and means for routing the first clock signal as the output clock signal the first time that the first clock signal transitions to the predetermined logic state after time $T_D$.

9. The clock routing circuit of claim 7, further comprising means for programmably selecting the predetermined logic state.

\* \* \* \* \*